(12) United States Patent
Tuominen

(10) Patent No.: US 11,219,129 B2
(45) Date of Patent: Jan. 4, 2022

(54) COMPONENT CARRIER WITH BLIND HOLE FILLED WITH AN ELECTRICALLY CONDUCTIVE MEDIUM AND FULFILLING A MINIMUM THICKNESS DESIGN RULE

(71) Applicant: AT&S (China) Co. Ltd., Shanghai (CN)

(72) Inventor: Mikael Tuominen, Pernio (FI)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/774,642

(22) Filed: Jan. 28, 2020

(65) Prior Publication Data

US 2020/0253054 A1 Aug. 6, 2020

(30) Foreign Application Priority Data

Jan. 31, 2019 (CN) .......................... 201910101367.5

(51) Int. Cl.
*H05K 1/00* (2006.01)
*H05K 1/02* (2006.01)
(Continued)

(52) U.S. Cl.
CPC ........... *H05K 1/116* (2013.01); *H05K 3/0035* (2013.01); *H05K 3/0038* (2013.01); *H05K 3/425* (2013.01);
(Continued)

(58) Field of Classification Search
CPC .. H05K 1/00; H05K 1/02; H05K 1/03; H05K 1/05; H05K 1/11; H05K 1/16; H05K 1/18;
(Continued)

(56) References Cited

U.S. PATENT DOCUMENTS 4,447,291 A * 5/1984 Schulte ................. H01L 21/465
204/192.32
4,461,672 A * 7/1984 Musser ............. H01L 21/31116
204/192.32

(Continued)

FOREIGN PATENT DOCUMENTS

CN  207022286 U  2/2018
CN  110891366 A  3/2020

OTHER PUBLICATIONS

Office Action in Application No. 201910101367.5; pp. 1-8; dated Jun. 3, 2021; China National Intellectual Property Administration; 6 Xitucheng Lu, Jimenqiao, Haidian Qu, Beijing City 100088, China.

(Continued)

*Primary Examiner* — Xiaoliang Chen
(74) *Attorney, Agent, or Firm* — Robert A. Blaha; Smith Tempel Blaha LLC

(57) ABSTRACT

A component carrier with a stack including at least one electrically insulating layer structure and at least one electrically insulating structure has a tapering blind hole formed in the stack and an electrically conductive plating layer extending along at least part of a horizontal surface of the stack outside of the blind hole and along at least part of a surface of the blind hole. A minimum thickness of the plating layer at a bottom of the blind hole is at least 8 μm.

17 Claims, 3 Drawing Sheets

(51) Int. Cl.
  *H05K 1/03* (2006.01)
  *H05K 1/05* (2006.01)
  *H05K 1/11* (2006.01)
  *H05K 1/16* (2006.01)
  *H05K 1/18* (2006.01)
  *H05K 3/00* (2006.01)
  *H05K 3/10* (2006.01)
  *H05K 3/12* (2006.01)
  *H05K 3/30* (2006.01)
  *H05K 3/40* (2006.01)
  *H05K 3/42* (2006.01)
  *H05K 3/46* (2006.01)
  *H01L 21/28* (2006.01)
  *H01L 21/46* (2006.01)
  *H01L 21/48* (2006.01)
  *H01L 21/56* (2006.01)
  *H01L 21/465* (2006.01)
  *H01L 21/471* (2006.01)
  *H01L 21/473* (2006.01)
  *H01L 21/768* (2006.01)
  *H01L 21/4763* (2006.01)
  *H01L 23/00* (2006.01)
  *H01L 23/29* (2006.01)
  *H01L 23/48* (2006.01)
  *H01L 23/498* (2006.01)
  *H01L 23/538* (2006.01)

(52) U.S. Cl.
  CPC ............. *H05K 2201/09509* (2013.01); *H05K 2201/09563* (2013.01); *H05K 2201/09827* (2013.01); *H05K 2203/107* (2013.01)

(58) Field of Classification Search
  CPC ........ H05K 1/116; H05K 3/00; H05K 3/0035; H05K 3/0038; H05K 3/10; H05K 3/12; H05K 3/30; H05K 3/40; H05K 3/42; H05K 3/46; H05K 3/48; H05K 3/425; H01L 21/28; H01L 21/46; H01L 21/48; H01L 21/56; H01L 21/465; H01L 21/471; H01L 21/473; H01L 21/768; H01L 21/4763
  USPC ........ 361/763, 748, 767; 174/251, 254, 255, 174/257, 260–262, 264, 266; 257/698, 257/755, 774; 29/825, 829, 830, 846, 29/847, 852; 438/128, 458, 479, 638, 438/645, 704; 1/1
  See application file for complete search history.

(56) References Cited

U.S. PATENT DOCUMENTS

| | | | | |
|---|---|---|---|---|
| 5,411,918 A * | 5/1995 | Keible | ............... | H01L 21/76802 257/737 |
| 5,534,461 A * | 7/1996 | Kuwajima | ........ | H01L 21/76877 257/E21.585 |
| 5,596,243 A * | 1/1997 | Tsuru | ................... | H03H 9/1035 310/348 |
| 6,405,431 B1 * | 6/2002 | Shin | ..................... | H05K 3/0038 205/126 |
| 7,528,053 B2 * | 5/2009 | Huang | ............. | H01L 21/76898 257/E21.597 |
| 7,821,106 B2 * | 10/2010 | Bieck | ................ | H01L 27/14618 257/621 |
| 7,875,809 B2 * | 1/2011 | Chang | ................. | H05K 3/4602 174/262 |
| 8,020,292 B1 * | 9/2011 | Kumar | ................ | H05K 3/4617 29/852 |
| 8,492,659 B2 * | 7/2013 | Nagase | ................. | H05K 3/381 174/266 |
| 10,461,006 B1 * | 10/2019 | Huemoeller | ........ | H01L 23/3128 |
| 2001/0002625 A1 * | 6/2001 | Fujii | ...................... | H05K 3/426 174/262 |
| 2002/0022361 A1 * | 2/2002 | Kim | ................... | H01L 21/76804 438/638 |
| 2002/0038726 A1 * | 4/2002 | Puymbroeck | ............ | H01L 23/13 174/267 |
| 2002/0083586 A1 * | 7/2002 | Iijima | .................. | H05K 3/0035 29/847 |
| 2002/0150838 A1 * | 10/2002 | Zhang | ................... | H01L 21/486 430/311 |
| 2005/0062160 A1 * | 3/2005 | Naito | ..................... | H05K 3/421 257/755 |
| 2005/0121768 A1 * | 6/2005 | Edelstein | ........... | H01L 21/76898 257/698 |
| 2005/0236177 A1 * | 10/2005 | Inagaki | ..................... | H05K 1/09 174/255 |
| 2006/0102386 A1 * | 5/2006 | Morimoto | ............ | H05K 3/4617 174/260 |
| 2006/0243478 A1 * | 11/2006 | Inagaki | ..................... | H01L 23/50 174/255 |
| 2007/0148829 A1 * | 6/2007 | Yoshino | ............... | H05K 3/4046 438/128 |
| 2007/0199735 A1 * | 8/2007 | Kim | ........................ | H05K 3/423 174/255 |
| 2008/0251494 A1 * | 10/2008 | Park | ........................ | C25D 7/123 216/13 |
| 2008/0296273 A1 * | 12/2008 | Lei | ........................ | H05K 3/0035 219/121.71 |
| 2009/0148594 A1 * | 6/2009 | Moran | ..................... | H05K 1/11 427/105 |
| 2009/0251869 A1 * | 10/2009 | Ikeda | ..................... | H05K 1/113 361/748 |
| 2010/0307803 A1 * | 12/2010 | Paul | ..................... | H05K 3/4676 174/257 |
| 2010/0307809 A1 * | 12/2010 | Noda | ..................... | H05K 3/4602 174/266 |
| 2012/0032338 A1 * | 2/2012 | Komori | ............ | H01L 21/31116 257/773 |
| 2012/0043128 A1 * | 2/2012 | Yoon | ..................... | H05K 3/429 174/266 |
| 2012/0055706 A1 * | 3/2012 | Mok | ..................... | H05K 1/162 174/260 |
| 2012/0168220 A1 * | 7/2012 | Lee | ......................... | H05K 3/429 174/264 |
| 2013/0017534 A1 * | 1/2013 | Nickel | ..................... | C12Q 1/18 435/5 |
| 2013/0119555 A1 * | 5/2013 | Sundaram | ......... | H01L 21/76843 257/774 |
| 2013/0223034 A1 * | 8/2013 | Rathburn | ............... | H05K 1/115 361/767 |
| 2014/0166355 A1 * | 6/2014 | Hong | ..................... | H05K 3/426 174/264 |
| 2014/0178688 A1 * | 6/2014 | Tour | ...................... | C01B 32/186 428/408 |
| 2015/0119252 A1 * | 4/2015 | Ladizinsky | ............. | H01L 27/18 505/170 |
| 2015/0168747 A1 * | 6/2015 | Kadono | ................... | G02F 1/155 348/360 |
| 2016/0192491 A1 * | 6/2016 | Kang | ..................... | H05K 1/113 174/251 |
| 2017/0357134 A1 * | 12/2017 | Wang | ................ | G02F 1/136209 |
| 2018/0143721 A1 * | 5/2018 | Matsueda | ............. | G06F 3/0445 |
| 2018/0218846 A1 * | 8/2018 | Mancevski | ............ | H01G 11/32 |
| 2019/0189589 A1 * | 6/2019 | Jung | ................... | H01L 25/50 |
| 2019/0363039 A1 * | 11/2019 | Appelt | ............. | H01L 23/49805 |
| 2019/0393183 A1 * | 12/2019 | Nad | ....................... | H01L 24/33 |
| 2020/0245461 A1 * | 7/2020 | Kaibuki | ................ | H05K 1/118 |
| 2020/0312881 A1 * | 10/2020 | Liu | ..................... | H01L 27/1288 |

OTHER PUBLICATIONS

English Translation of Cover of Office Action in Application No. 201910101367.5; pp. 1-3; dated Jun. 3, 2021; China National

(56) References Cited

OTHER PUBLICATIONS

Intellectual Property Administration; 6 Xitucheng Lu, Jimenqiao, Haidian Qu, Beijing City 100088, China.

* cited by examiner

COMPONENT CARRIER WITH BLIND HOLE FILLED WITH AN ELECTRICALLY CONDUCTIVE MEDIUM AND FULFILLING A MINIMUM THICKNESS DESIGN RULE

CROSS-REFERENCE TO RELATED APPLICATION

This application claims priority to Chinese Patent Application No. 201910101367.5 filed Jan. 31, 2019, the disclosure of which is hereby incorporated herein by reference.

TECHNICAL FIELD

Embodiments of the invention relate to a component carrier and a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

In particular, it may be advantageous to efficiently contact electrically conductive layer structures and/or components mounted on and/or embedded in a component carrier with proper electric reliability.

SUMMARY

There may be a need to manufacture a component carrier with proper electric reliability.

According to an exemplary embodiment of the invention, a component carrier is provided, wherein the component carrier comprises a stack comprising at least one electrically conductive layer structure and/or at least one electrically insulating layer structure, a tapering blind hole (in particular a laser blind hole) formed in the stack, and an electrically conductive plating layer (in particular a curved layer) extending along at least part of a horizontal surface of the stack outside of the blind hole and along at least part of a surface of the blind hole, wherein a minimum thickness of the plating layer at a bottom of the blind hole is at least 8 µm.

According to another exemplary embodiment of the invention, a method of manufacturing a component carrier is provided, wherein the method comprises forming a blind hole at least partially in an electrically insulating layer structure (preferably, but not necessarily by laser drilling), and plating an electrically conductive plating layer along and/or above at least part of a horizontal surface of the electrically insulating layer structure outside of the blind hole and extending along at least part of a surface of the blind hole, wherein a smallest thickness of the plating layer at a bottom of the blind hole is at least 8 µm.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "tapering blind hole" may particularly denote a hole extending vertically into, but not entirely through a layer stack or an electrically insulating layer structure. Preferably, the blind hole may be formed as a laser blind hole, i.e. by a laser process. More specifically, such a laser blind hole may be a blind hole having tapering shape as a result from the energy impact of one or more laser beams which may be irradiated onto one of the two opposing main surfaces of a stack or an electrically insulating layer structure. However, it is alternatively also possible that the blind hole is formed by another process than laser processing, for instance by a plasma process, etc.

In the context of the present application, the term "plating layer" may particularly denote a, for instance, three-dimensionally curved or bent electrically conductive film manufactured by plating, in particular by galvanic plating on a base defining the shape of the plating layer. For instance, a thickness of the plating layer may be significantly smaller, in particular at least 5 times smaller, than an extension of the plating layer in its length and/or width directions. In particular, such a plating layer can be formed by plating following blind hole formation in a stack or an electrically insulating layer structure. After such a plating procedure, the previously formed blind hole is only partially filled with electrically conductive material constituting the plating layer, so that the plating layer is delimited in an upward direction by a demarcation surface which may for instance be partially planar and may partially have a curved (in particular concave) shape.

In the context of the present application, the term "stack" may particularly denote a sequence of two or more layer structures formed on top of each other.

In the context of the present application, the term "horizontal surface" of a stack or a layer structure may particularly denote an at least partially planar surface area of a stack or a layer structure of a substantially plate shaped component carrier being arranged within a horizontal plane when a main surface of the substantially plate shaped component carrier is placed on a horizontal support.

According to an exemplary embodiment of the invention, a manufacturing method for manufacturing a component carrier with a blind hole being filled with electrically conductive material is provided, wherein the electric reliability of the filled blind hole is highly advantageous. It has been surprisingly found that when fulfilling a specific design rule for the plating layer filling part of the blind hole of a component carrier, the electric and mechanical reliability of the obtained component carrier is high. This means that undesired phenomena such as cracks in the electrically conductive filling medium filling the blind hole and/or interior voids remaining in an interior of the blind hole filled with electrically conductive material can be reliably prevented or at least strongly suppressed when meeting this design rule. More specifically, the mentioned design rule relates to the fact that a minimum thickness of the plating layer at a bottom of the blind hole is at least 8 μm.

According to an exemplary embodiment of the invention, a blind hole in an electrically insulating layer structure filled partially or entirely with electrically conductive material to form a trace or wire of the component carrier can be provided which results in a high reliability of a correspondingly manufactured component carrier. Such a component carrier may comply even with tight reliability requirements in view of the described formation of the metal filling layer(s) of the via. More specifically, by controlling plating for forming an electrically conductive filling structure (in particular a copper structure with a substantially horizontal extension in the blind hole), a significantly increased reliability performance can be obtained. Descriptively speaking, by controlling the plating thickness on the bottom of the blind hole, the reliability performance can be improved. Thus, a robust and reliable blind hole core process can be obtained. Such a process is also properly compatible with a modified semi-additive processing (mSAP) process flow.

In the following, further exemplary embodiments of the component carrier and the method will be explained.

A skilled person is aware of the fact that the plating layer (i.e. a layer formed by plating) which may line at least part of sidewalls and at least part of the bottom portion of the blind hole and at least part of a main surface of an electrically insulating or an electrically conductive layer structure can be visually distinguished or separated from other electrically conductive material, such as another plating structure, another structure formed by electroless deposition, a metal foil, etc. Such a distinction is possible when inspecting the cross-section of the component carrier showing interfaces between the plating layer and adjacent constituents of the component carrier.

In an embodiment, the electrically conductive plating layer is a curved layer, in particular not extending entirely horizontally but extending with two edges in a cross-sectional view. One or more further electrically conductive structures (such as one or more further plating layers) may be formed on top of the aforementioned plating layer. An electrically conductive filling medium in the blind hole may thus be an array of several electrically conductive layers filling the blind via partially or entirely. In particular, these electrically conductive layers may extend not substantially horizontally, but may for instance extend with two edges to become more and more horizontal afterwards.

In an embodiment, the thickness of the plating layer along the entire surface of the blind hole is at least 8 μm. In other words, no position of the bottom and the sidewalls of the blind hole may be covered with material of the plating layer having a thickness of less than 8 μm. It has turned out that this design rule allows obtaining component carriers with high mechanical and electrical reliability.

In an embodiment, a ratio between a thickness (in particular a minimum thickness) of the plating layer on the horizontal surface of the stack and the minimum thickness of the plating layer at the bottom of the blind hole is in a range between 15% and 40%, in particular in a range between 20% and 30%. When this design rule is fulfilled (for instance in the embodiment illustrated in FIG. 1 to FIG. 4), the tendency of cracks in particular in a region of an overhang of a top side electrically conductive layer structure beyond the electrically insulating layer structure defining a major portion of the blind hole is strongly suppressed.

In another embodiment, a ratio between a thickness (in particular a minimum thickness) of the plating layer on the horizontal surface of the stack and the minimum thickness of the plating layer at the bottom of the blind hole is in a range between 20% and 60%, in particular in a range between 30% and 50%. In case of modified semi-additive processing (mSAP), there may be a copper foil having a thickness in the range between 1 μm and 2 μm on the surface, and for instance 4 μm thick plating on the copper foil. In this case the minimum thickness at the bottom may be for instance in a range between 8 μm and 12 μm. For instance, a proper ratio may then be within the above ranges.

In still another embodiment, a ratio between a thickness (in particular a minimum thickness) of the plating layer on the horizontal surface of the stack and the minimum thickness of the plating layer at the bottom of the blind hole is in a range between 20% and 85%, in particular in a range between 30% and 75%. In case of high-density integration (HDI), there can be a copper foil on the surface having a thickness in the range of for instance 8 μm to 11 μm. The thickness of the plating layer on the copper foil may for instance be in a range between 4 μm and 6 μm. In this case the minimum thickness at the bottom may be for instance in a range between 8 μm and 13 μm. For instance, a proper ratio may then be within the above ranges.

In an embodiment, a demarcation surface of the plating layer in the blind hole and facing away from the stack extends laterally outwardly from the bottom of the blind hole towards a lateral indentation and then extends laterally inwardly from the indentation up to an outer end of the blind hole. Component carriers with such an indentation showed a high reliability. Without wishing to be bound to a specific theory, it is presently assumed that material of the plating layer can be anchored in such an indentation or pocket, which increases the reliability of the plated blind hole.

In an embodiment, the minimum thickness of the plating layer at the bottom of the blind hole is at least 25 μm. With plating layers having this thickness, no issues with crack formation occur.

In another embodiment, the thickness of the plating layer at the bottom of the blind hole is in a range between 8 μm and 12 μm. Good results have been obtained within this range.

In an embodiment, the bottom of the blind hole is delimited at least partially, preferably entirely, by one of the at least one electrically conductive layer structures. The plating layer may then act as an electric connecting element like a trace or wire for contacting the electrically conductive layer structure delimiting the blind hole at the bottom side. The mentioned electrically conductive layer structure delimiting the bottom may also contact a component embedded in the stack or may contact the pad of such a component (for instance a semiconductor die).

In an embodiment, one of the at least one electrically conductive layer structures has a window defining an outer end of the blind hole. Said electrically conductive layer structure may also define at least part of the horizontal surface of the stack outside of the blind hole. In the context of the present application, the term "window" may particularly denote a through hole, in particular a circular through hole, extending through said electrically conductive layer structure, for instance as a result of a laser treatment of this electrically conductive layer structure. Descriptively speaking, the energy of the laser beam may remove material of the electrically conductive layer structure in the region of the window. Thus, the component carrier may comprise a patterned electrically conductive layer structure (in particular a metal foil) having a window which may be substantially aligned with the tapering blind hole extending into the electrically insulating layer structure. Thus, an electrically conductive layer may be attached to a main surface of the electrically insulating layer structure. Preferably, the electrically conductive layer structure may be a copper foil. By a laser shot, the window may be formed in the electrically conductive layer structure and a lower portion of the blind hole may be formed in the electrically insulating layer structure. It is however also possible to form the window with another process (for instance by a plasma process) than by laser processing.

In an embodiment, the component carrier has an overhang between the electrically conductive layer structure with the window and one of the at least one electrically insulating layer structure in which the blind hole is formed. In the context of the present application, the term "overhang" may particularly denote a partial length of the electrically conductive layer structure directly adjacent to the respective window over which partial length the electrically conductive layer structure extends laterally beyond (or hangs freely in a cantilever fashion) over the electrically insulating layer structure. Thus, the overhanging material of the respective electrically conductive layer structure may be locally not supported by material of the electrically insulating layer structure along the extension of the overhang due to the presence of a portion of the blind hole in a pocket below the overhanging electrically conductive layer structure. What concerns the above statement that overhanging material may be locally not supported, it should be said that the overhang may relate to the substantially resin free area beneath the respective electrically conductive layer structure. However, a person skilled in the art will understand that some residue resin might be present within a gap relating to the overhang. In order to quantitatively determine or measure the value of the overhang, the length of the substantially resin-free (wherein resin may refer to the electrically insulating layer structure) undercut directly under an overhanging electrically conductive layer structure may be measured (in particular even if it is not the most receding point or total relief below the overhanging electrically conductive layer structure, for example copper layer). In other words, for measuring the overhang, the undercut directly below the electrically conductive layer structure may be measured. Preferably, the overhang of the first electrically conductive layer structure beyond the sidewall of the electrically insulating layer structure delimiting the blind hole is not more than 10 μm. As a result, a filled blind hole with high reliability can be obtained, since the formation of cracks and other undesired phenomena may be prevented with such a small overhang.

In an embodiment, the thickness (in particular a minimum thickness) of the plating layer at the exterior surface or on the horizontal surface of the stack is in a range between 2 μm and 3 μm. The thickness of the plating layer at the exterior surface of the stack, i.e. outside of the blind hole, may be smaller than in the (for instance substantially cup-shaped) blind hole.

In an embodiment, the component carrier comprises an electrically conductive seed layer at least lining the blind hole and being arranged between the stack and the plating layer. For instance, the seed layer may continuously line the entire surface delimiting the blind hole and at least part (in particular a connected part) of the horizontal surface of the stack. The seed layer, preferably made of copper, may be formed for instance by electroless deposition. After having formed such a seed layer covering the below surface with a thin layer (for instance having a thickness in the range between 0.5 μm and 5 μm, for instance 1 μm) of electrically conductive material such as copper, a substantial amount of electrically conductive material (preferably copper) may be formed on this seed layer preferably by plating or galvanic deposition (for instance with a thickness in the range between 5 μm and 30 μm). It is also possible that such a seed layer or seed structure is provided as a plurality of (in particular very thin) layers, for instance with a cumulative thickness in a range between 0.5 μm and 5 μm. For instance, a palladium and/or titanium layer may be covered with a copper layer on top to form a multilayer seed layer. This procedure of filling the blind hole with the correspondingly formed plating layer has turned out as particularly efficient.

In an embodiment, a diameter of the blind hole at an outer end of the blind hole is not more than 100 μm. For instance, the diameter of the outer end of the blind hole is in a range between 70 μm and 100 μm, preferably between 80 μm and 90 μm. In an embodiment, a diameter of the blind hole at the bottom of the blind hole is in a range between 50 μm and 80 μm, preferably between 60 μm and 70 μm. In view of the tapering shape of the blind hole, the exterior diameter of the blind hole may be larger than the diameter at the bottom.

In an embodiment, the electrically insulating layer structure is a core, in particular a fully cured prepreg. Such a fully cured core may comprise resin which is substantially no more able to cross-link but is already highly or completely cross-linked. C-stage resin may or may not be 100% cross-linked polymer chains, but may at least have a network of highly crosslinked polymer chains, so that the final product cannot be thermally reformed and is insoluble. As a consequence, such a material will not re-melt or become flowable again during a subsequent lamination procedure in which one or more electrically conductive layer structures and/or electrically insulating layer structures may be laminated on the top surface of the core with copper filled blind hole(s). For instance, such a core may be made of FR4 material, i.e. resin including reinforcing particles such as glass fibers or glass spheres.

In an embodiment, the plating layer also covers at least part of the sidewalls. For instance, the plating layer may continuously cover the entire surface delimiting the blind hole and at least part of the connected horizontal surface of the stack. During the manufacturing process, it may be possible to firstly cover the blind hole (and optionally also the horizontal surface outside of the blind hole) with a thin seed layer of electrically conductive material, preferably copper. Subsequently, the plating layer may be formed by a plating procedure, for instance by galvanic plating. During such a plating procedure, the respective surface portions may be covered with a thicker layer of electrically conductive material. Thus, a substantially U-shaped plating layer with a horizontal planar part may be obtained.

In an embodiment, the component carrier comprises an electrically conductive structure filling at least part of a volume above the plating layer. Such an electrically conductive structure may be a single layer or may be a plurality of stacked layers. Each of these layers may be curved or planar. After having completed a plating procedure of forming the plating layer, remaining empty spaces within the blind hole above the demarcation surface may be filled partially or entirely with further electrically conductive material such as copper. This filling is denoted as electrically conductive structure. Preferably, such an electrically conductive structure may be formed in one or more plating procedures being separate from a plating procedure of forming the plating layer. As known by those skilled in the art of component carrier manufacture, a transition between the plating layer and the structure can be seen in a cross-sectional view of a manufactured component carrier. Thus, the plating layer on the one hand and the structure on the other hand can be visually separated in a cross-sectional view of the component carrier.

In an embodiment, the electrically conductive structure is at least one further plating structure. It is also possible to manufacture the structure with a sequence of multiple subsequent plating structures. In a cross-sectional view of the component carrier, the individual plating layers forming together the structure may be visually inspectable and can be visually separated.

In an embodiment, the plating layer forms an electrically conductive trace, in particular for contacting a component being surface mounted on the component carrier or being embedded in the component carrier. In other words, the blind hole with electrically conductive metal filling medium may form a plated blind hole.

In an embodiment, the minimum thickness of the plating layer at a bottom of the blind hole is not more than 40 µm. A proper filling of a volume above the plating layer by a structure can be promoted by preventing the plating layer from becoming excessively thick.

In an embodiment, one or more of the at least one electrically conductive layer structure, the plating layer and the electrically conductive structure is patterned, in particular commonly patterned. For instance, such a patterned layer sequence may form at least one electrically conductive trace, in particular extending horizontally. Thus, simultaneously with the filling of the blind hole with electrically conductive material, it is also possible to form and precisely define one or more electrically conductive traces based on the plated material. This may reduce the ecological foot print of component carrier manufacture.

In an embodiment, the laser drilling comprises forming a window at least partially aligned with the blind hole and extending through an electrically conductive layer structure stacked on the electrically insulating layer structure. A slight misalignment between window and blind hole may result from the formation of a lateral overhang of the electrically conductive layer structure beyond the blind hole. However, material of both the exterior electrically conductive layer structure and the electrically insulating layer structure beneath may be removed efficiently with a single laser shot. Alternatively, multiple laser shots are possible.

In an embodiment, the plating comprises forming part of the electrically conductive plating layer along and on at least part of a horizontal surface of the electrically conductive layer structure outside of the blind hole and extending along the surface of the blind hole. For instance, the plating layer may extend continuously along the entire exterior surface of the blind hole and along at least part of an upper horizontal main surface of the exterior electrically conductive layer structure.

In another embodiment, the method comprises forming the blind hole in an exposed main surface of the electrically insulating layer structure while one or both of opposing main surfaces of the electrically insulating layer structure is or are not covered by an electrically conductive layer structure. Hence, it is possible that no metal foil (in particular no copper foil) is arranged between the electrically insulating layer structure of the stack and the electrically conductive plating layer.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Outside of one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as rein-forced or non-reinforced resins, for instance epoxy resin or bismaleimide-triazine resin, more specifically FR-4 or FR-5), cyanate ester, polyphenylene derivate, glass (in particular glass fibers, glass-spheres, multi-layer glass, glass-like materials), prepreg material, photo-imageable dielectric material, polyimide, polyamide, liquid crystal polymer (LCP), epoxy-based build-up material, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg, FR4, or epoxy-based build-up film or photo-imageable dielectrics are usually preferred, other materials may be used as well. For high-frequency applications, high-frequency materials such as polytetrafluoroethylene, liquid crystal polymer and/or cyanate ester resins may be implemented in the component carrier as electrically insulating layer structure.

In an embodiment, at least one of the at least one electrically conductive layer structure, the plating layer and the structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
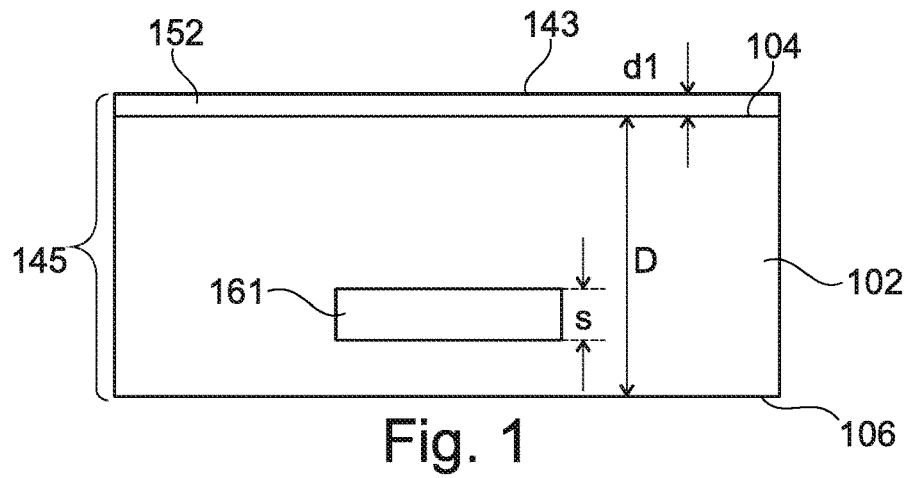
FIG. 1, FIG. 2, FIG. 3 and FIG. 4 illustrate cross-sectional views of structures obtained while performing a method of manufacturing a component carrier with a laser blind hole by a laser shot treatment and by subsequently filling the laser blind hole at least partially with electrically conductive filling medium according to an exemplary embodiment of the invention.

The illustrations in the drawings are schematically presented. In different drawings, similar or identical elements are provided with the same reference signs.

Figure 2:
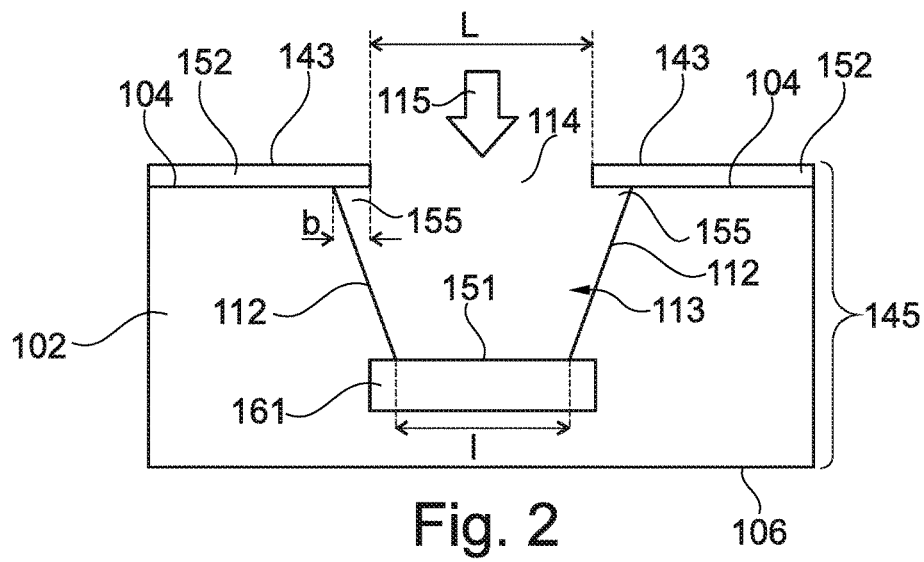
Figure 3:
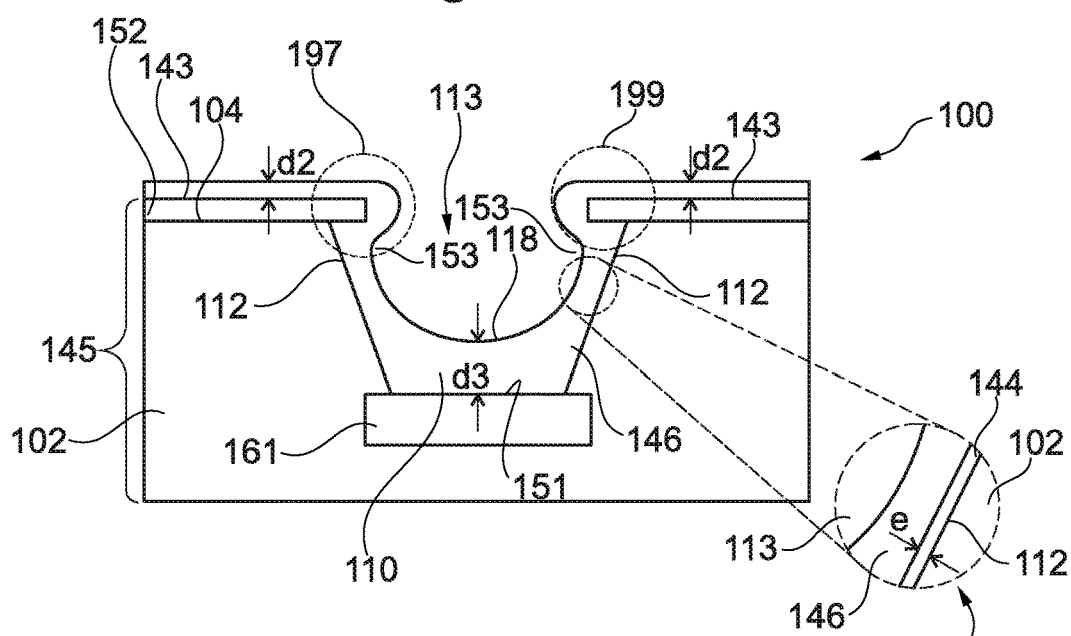
Figure 4:
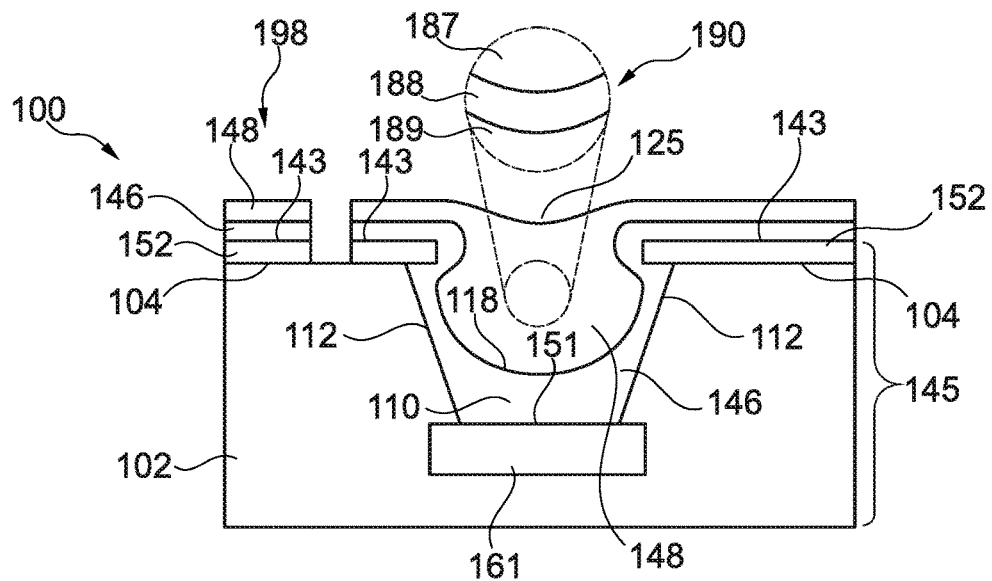

FIG. 1 to FIG. 4 illustrate cross-sectional views of structures obtained during carrying out methods of manufacturing a component carrier 100, shown in FIG. 4, with a laser blind hole 113 by a laser shot treatment from a top side and by subsequently filling the laser blind hole 113 with electrically conductive filling medium formed by multiple filling procedures according to an exemplary embodiment of the invention.

FIG. 1 shows a laminated layer stack 145 comprising electrically conductive layer structures 152, 161 and an electrically insulating layer structure 102.

First electrically conductive layer structure 152 is arranged on an upper main surface 104 of electrically insulating layer structure 102. Second electrically conductive layer structure 161 is embedded in an interior of the electrically insulating layer structure 102, i.e. between the upper main surface 104 and a lower main surface 106 of electrically insulating layer structure 102. The first electrically conductive layer structure 152 may be a laminated copper foil. Thus, the first electrically conductive layer structure 152 is a continuous layer. The first electrically conductive layer structure 152 may have a thickness d1 of less than 12 µm, in particular less than 5 µm, for example in a range between 2 µm and 3 µm. The second electrically conductive layer structure 161 may be a patterned copper layer. Hence, the second electrically conductive layer structure 161 is a buried trace. The second electrically conductive layer structure 161 may have a thickness, s, of less than 10 µm, in particular less than 5 µm, for instance in a range between 2 µm and 3 µm.

In the shown embodiment, the electrically insulating layer structure 102 may comprise resin (in particular epoxy resin), optionally comprising reinforcing particles such as glass fibers or glass spheres. For example, the electrically insulating layer structure 102 may be a thin core. For instance, a vertical thickness, D, of the electrically insulating layer structure 102 may be less than 180 µm, in particular less than 110 µm, for instance in a range between 40 µm and 60 µm. With such thin cores, reliability issues are particularly pronounced.

A horizontal surface of stack 145 is denoted with reference numeral 143.

Referring to FIG. 2, a laser blind hole 113 is formed by carrying out a laser shot 115 irradiated onto horizontal surface 143. Laser processing may be carried out by an appropriate laser source, for instance by an excimer laser and/or a carbon dioxide laser.

The laser shot 115 forms a window 114 or through hole extending through the first electrically conductive layer structure 152 on the upper main surface 104 of the electrically insulating layer structure 102. Thus, the first electrically conductive layer structure 152 is provided with window 114 defining an outer end of the blind hole 113. Furthermore, the laser shot 115 removes material of the electrically insulating layer structure 102 below window 114 and thereby exposes the second electrically conductive layer structure 161. The exposed portion of the second electrically conductive layer structure 161 forms a bottom 151 of blind hole 113. In other words, the bottom 151 of the blind hole 113 is delimited by the second electrically conductive layer structures 161. The tapering blind hole 113 is laterally delimited by sidewalls 112.

As shown in FIG. 2 as well, a lateral overhang 155 may be formed between the first electrically conductive layer structure 152 next to the window 114 and the electrically insulating layer structure 102 in which the major portion of the blind hole 113 is formed. Preferably, a dimension, b, of the overhang 155 is no more than 10 µm. This can be adjusted by changing the parameters of the laser shot 115 in terms of energy, duration, etc.

A diameter, L, of the blind hole 113 at an outer end of the blind hole 113 and thus a diameter of window 114 is less than or equal to 100 µm, for instance 80 µm. A smaller diameter, l, of the tapering blind hole 113 at a bottom 151 of the blind hole 113 may be smaller than L, for instance may be 65 µm.

In order to obtain the component carrier 100 shown in FIG. 3, the laser blind hole 113 according to FIG. 2 is made subject to a first procedure of filling it with an electrically conductive medium such as copper.

In order to accomplish this, it is preferable to firstly carry out an electroless deposition procedure to thereby form a thin seed layer 144 of copper covering (in particular after a pre-treatment, for instance with palladium and/or titanium) the sidewalls 112 of the electrically insulating layer structure 102 and the bottom 151 delimiting the laser blind hole 113, as well as covering exposed surface portions of first electrically conductive layer structure 152. This can be seen, for the example of sidewalls 112, in a detail 121 in FIG. 3. A thickness, e, of the seed layer 144 may be for instance 0.5 µm. However, it is also possible that the seed layer 144 has a thickness above 1 µm and/or that several cumulative seed layers are provided. For example, a thickness of a seed layer 144 or a cumulative thickness of a plurality of seed layers may be in a range between 0.5 µm and 5 µm. When multiple seed layers are provided, they may comprise an organic (for instance polymer) layer, a palladium layer, and/or a copper layer.

Subsequently, further electrically conductive material (such as copper) may be deposited on the seed layer 144 by a plating procedure, in particular by galvanic plating. Thus, the sidewalls 112, the bottom wall 151 of the second electrically conductive layer structure 161 as well as the first electrically conductive layer structure 152 are covered by a thicker plating layer 146 of electrically conductive filling medium such as copper. Hence, the shown structure comprises electrically conductive plating layer 146 extending continuously or uninterruptedly along horizontal surface 143 of the stack 145 outside of the blind hole 113 and along an entire exposed surface of the blind hole 113. As shown, the plating layer 146 is formed to be delimited by an upper demarcation surface 118 oriented upwardly. It should be said that it is well-known by a skilled person that the demarcation surface 118 is clearly visible when imaging a cross-section of the component carrier 100. Forming the electrically conductive plating layer 146 may be carried out by galvanic plating, preferably following the formation of the seed layer 144.

In the region of the narrowest portion of the laser blind hole 113, i.e. at bottom 151, a substantially horizontal bridge structure 110 is formed as a portion of the plating layer 146 connecting the opposing sidewalls 112. A concave upper limiting surface of the plating layer 146 corresponds to the demarcation surface 118.

Good results in terms of reliability can be obtained when thickness, d2, of the plating layer 146 at the exterior horizontal surface 143 of the stack 145 is in a range between 2 µm and 3 µm, for instance is 2.5 µm. In the shown embodiment, the plating layer 146 has a homogeneous or at least substantially homogeneous thickness d2 on the horizontal surface 143 of stack 145. When, in other embodiments, the plating layer 146 does not have a homogeneous thickness d2 on the horizontal surface 143 of stack 145, the minimum thickness d2 of the plating layer 146 on the horizontal surface 143 of stack 145 may be in a range between 2 µm and 3 µm.

Even more importantly, the plating layer 146 should have a minimum thickness, d3, at bottom 151 of the blind hole 113 of at least 8 µm. According to FIG. 3, the minimum thickness d3 is a vertical thickness of plating layer 146. When this design rule is fulfilled, a component carrier 100 with a high electric reliability can be obtained. For instance, d3 is in a range between 8 µm and 12 µm or is even at least 25 µm. In the shown embodiment, the thickness of the plating layer 146 within the blind hole 113 is inhomogeneous. In order to promote proper filling of a volume above the plating layer 146 with structure 148, it may be advantageous to prevent plating layer 146 to become excessively thick. For instance, a maximum value of the minimum thickness, d3, of the plating layer 146 on bottom 151 may be limited to 40 µm, if an extremely reliable component carrier 100 is desired. Otherwise, the thickness may be also above 40 µm.

A particularly high reliability can be obtained when a ratio d2/d3 between the minimum thickness d2 of the plating layer 146 on the exterior upper horizontal surface 143 of the stack 145 and the minimum thickness d3 of the plating layer 146 at the bottom 151 of the blind hole 113 is in a range between 20% and 30%, for instance about 25%. When this design rule is fulfilled, regions with high crack risk being denoted with reference numerals 197, 199 in FIG. 3 can be very safely prevented from causing reliability issues.

In the shown embodiment, the plated electrically conductive plating layer 146 extends along the entire exterior upper horizontal surface 143 of the stack 145 and along an entire surface of the blind hole 113.

As shown in FIG. 3, demarcation surface 118 of the plating layer 146 in the blind hole 113 and facing away from the stack 145 extends laterally outwardly from the bottom 151 of the blind hole 113 towards a circumferential lateral indentation 153 and then extends laterally inwardly from the indentation 153 up to an outer end of the blind hole 113. The circumferential indentation 153 may function as a pocket with a moderate undercut to which electrically conductive material may be properly applied.

Experiments have shown that in particular regions 197 and 199 of component carrier 100 may be specifically prone to undesired crack formation. However, analysis have also shown that if the smallest thickness d3 of the plating structure 146 on the bottom 151 is at least 8 µm, the tendency of correct formation can be strongly suppressed. Synergistically, the tendency of crack formation can be suppressed even stronger if additionally, the ratio d2/d3 is about 25%±5%.

Referring to FIG. 4, an electrically conductive structure 148 filling a major part between the demarcation surface 118 and the upper main surface of the component carrier 100 may be formed. This can be done by carrying out one or more further galvanic plating procedures following the previous plating procedure of forming the plating layer 146. Thereby, multiple further plating structures 187, 188, 189 may be formed, as shown in a detail 190, as constituents of structure 148. Thus, the component carrier 100 according to FIG. 4 can be obtained by carrying out one or more further plating procedures. Thereby, the structure 148, which may for instance consist of copper, can be obtained. In the shown embodiment, a small dip 125 remains at an upper side of the shown component carrier 100. In other embodiments, the structure 148 fills the remaining recess above the demarcation surface 118 almost completely. A skilled person will understand that the demarcation surface 118 is clearly visible when imaging a cross-section of the component carrier 100.

In the shown embodiment, the illustrated component carrier 100 can be a laminate-type plate-shaped component carrier 100 such as a printed circuit board (PCB).

FIG. 4 also illustrates that the exterior electrically conductive layer structure 152, the plating layer 146 and the electrically conductive structure 148 are commonly patterned on a horizontal surface of the electrically insulating layer structure 102 outside of the blind hole 113 so as to form a stacked layer sequence forming an electrically conductive trace 198. Thus, at least one electrically conductive trace 198 used for connection purposes can be formed simultaneously with the filling of the blind hole 113.

Figure 5:
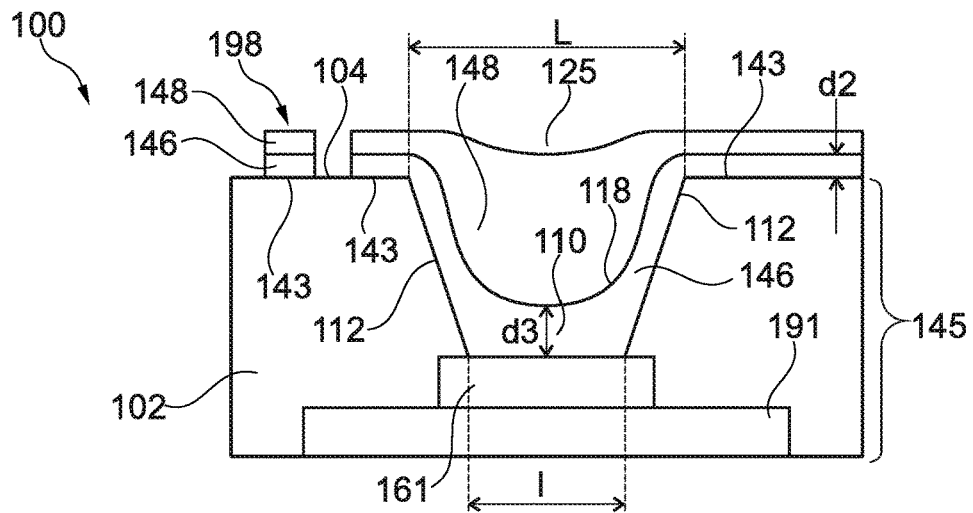
FIG. 5 illustrates a schematic cross-sectional view of a component carrier with laser blind hole according to another exemplary embodiment of the invention.

FIG. 5 illustrates a schematic cross-sectional view of a component carrier 100 with laser blind hole 113 according to another exemplary embodiment of the invention.

In contrast to the embodiment according to FIG. 1 to FIG. 4, a manufacturing procedure for manufacturing the component carrier 100 according to FIG. 5 is carried out without the first electrically conductive layer structure 152 on the exterior main surface 104 of the electrically insulating layer structure 102. In other words, laser drilling may be carried out directly on the dielectric surface of electrically insulating layer structure 102. During the plating procedure described referring to FIG. 3, in a corresponding manufacturing method for obtaining the component carrier 100 shown in FIG. 5 also the exposed dielectric surface of the electrically insulating layer structure 102 is covered with material of the plating structure 146. Thus, it may be dispensable to connect electrically conductive layer structure 152 to the exterior main surface 104 of the electrically insulating layer structure 102 before plating, which renders the manufacturing method simple.

Furthermore, FIG. 5 shows that below a second electrically conductive layer structure 161, a component 191 is embedded in the stack 145 and is electrically connected via the second electrically conductive layer structure 161, plating structure 146, and structure 148 forming a trace. For instance, embedded component 191 can be a semiconductor chip and the second electrically conductive layer structure 161 can be a pad of the component 191.

FIG. 5 also illustrates that the plating layer 146 and the electrically conductive structure 148 are commonly patterned on a horizontal surface 143 of the electrically insulating layer structure 102 outside of the blind hole 113 so as to form a stacked layer sequence forming a further electrically conductive trace 198. Thus, at least one further electrically conductive trace 198 used for connection purposes can be formed simultaneously with the filling of the blind hole 113.

Figure 6:
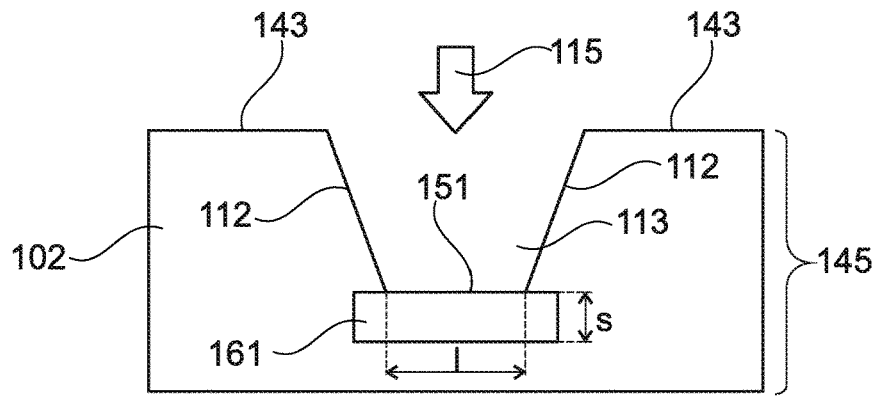
FIG. 6 illustrates a schematic cross-sectional view of a preform of a component carrier with an exposed electrically insulating layer structure in which a laser blind hole is formed according to another exemplary embodiment of the invention.

FIG. 6 illustrates a schematic cross-sectional view of a preform of a component carrier 100 with an exposed electrically insulating layer structure 102 in which a laser blind hole 113 is formed according to another exemplary embodiment of the invention. Thus, the upper main surface of the electrically insulating layer structure 102 is not covered by metallic material when forming laser blind hole 113.

Figure 7:
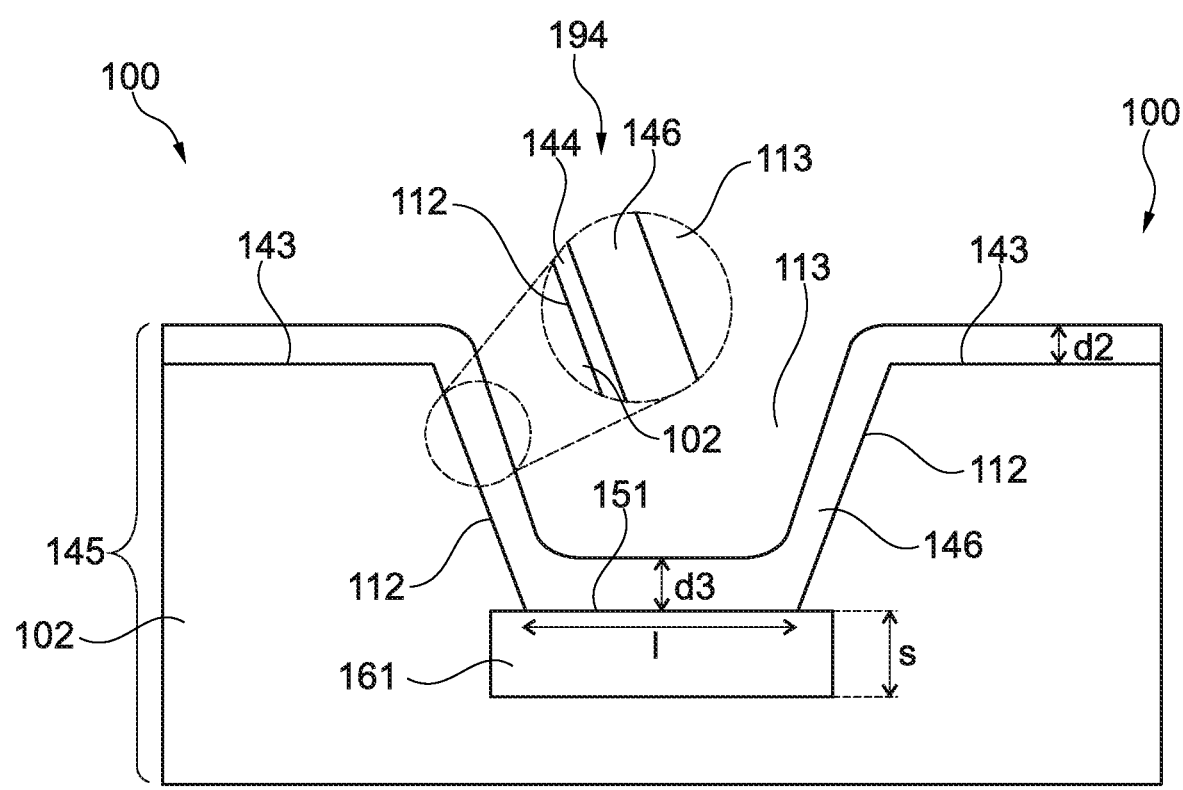
FIG. 7 illustrates a schematic cross-sectional view of a component carrier according to an exemplary embodiment of the invention formed based on the preform of FIG. 6 by forming a seed layer and subsequently a plating layer.

FIG. 7 illustrates a schematic cross-sectional view of a component carrier 100 according to an exemplary embodiment of the invention formed based on the preform of FIG. 6 by forming a seed layer 144 and subsequently a plating layer 146 (as shown in detail 194). The plating layer 146 continuously lines the exterior horizontal planar main surface portion of the electrically insulating layer structure 102 as well as the entire surface defining blind hole 113.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a stack comprising at least one electrically conductive layer structure and/or at least one electrically insulating layer structure;
   a tapering blind hole formed in the stack;
   an electrically conductive plating layer extending along at least part of a horizontal surface of the stack outside of the blind hole and along at least part of a surface of the blind hole;
   wherein a minimum thickness of the plating layer at a bottom of the blind hole is at least 8 µm;
   wherein the at least one electrically conductive layer structure has a window defining an outer end of the tapering blind hole and/or defines at least part of the horizontal surface of the stack outside of the blind hole; and an overhang of the electrically conductive layer structure with the window, which electrically conductive layer structure is arranged on and extends laterally beyond one of the at least one electrically insulating layer structure in which part of the blind hole is formed.

2. The component carrier according to claim 1, comprising one of the following features:
- wherein a ratio between a thickness, in particular a minimum thickness, of the plating layer on the horizontal surface of the stack and the minimum thickness of the plating layer at the bottom of the blind hole is in a range between 15% and 40%, in particular in a range between 20% and 30%;
- wherein a ratio between a thickness, in particular a minimum thickness, of the plating layer on the horizontal surface of the stack and the minimum thickness of the plating layer at the bottom of the blind hole is in a range between 20% and 60%, in particular in a range between 30% and 50%;
- wherein a ratio between a thickness, in particular a minimum thickness, of the plating layer on the horizontal surface of the stack and the minimum thickness of the plating layer at the bottom of the blind hole is in a range between 20% and 85%, in particular in a range between 30% and 75%.

3. The component carrier according to claim 1, wherein a demarcation surface of the plating layer in the blind hole and facing away from the stack extends laterally outwardly from the bottom of the blind hole towards a lateral indentation and then extends laterally inwardly from the indentation up to an outer end of the blind hole.

4. The component carrier according to claim 1, wherein the minimum thickness of the plating layer at the bottom of the blind hole is at least 25 µm.

5. The component carrier according to claim 1, wherein the minimum thickness of the plating layer at the bottom of the blind hole is in a range between 8 µm and 12 µm.

6. The component carrier according to claim 1, wherein the bottom of the blind hole is at least partially, in particular completely, delimited by one of the at least one electrically conductive layer structure.

7. The component carrier according to claim 1, wherein a thickness, in particular a minimum thickness, of the plating layer on the horizontal surface of the stack is in a range between 2 µm and 3 µm.

8. The component carrier according to claim 1, comprising an electrically conductive seed layer lining at least part of the blind hole and being arranged between the stack and the plating layer.

9. The component carrier according to claim 1, comprising at least one of the following features:
- wherein a diameter of an outer end of the blind hole is not more than 100 µm;
- wherein a diameter of the bottom of the blind hole is in a range between 50 µm and 80 µm, in particular in a range between 60 µm and 70 µm.

10. The component carrier according to claim 1, comprising at least one of the following features:
- wherein the electrically insulating layer structure is a core, in particular a fully cured prepreg;
- wherein the plating layer also covers at least part of sidewalls of the stack delimiting the blind hole.

11. The component carrier according to claim 1, further comprising:
- an electrically conductive structure filling at least part of a volume between the plating layer and an exterior of the blind hole.

12. The component carrier according to claim 11, wherein the electrically conductive structure comprises at least one further plating structure or layer, in particular a plurality of stacked plating structures or layers.

13. The component carrier according to claim 1, comprising at least one of the following features:
- wherein the plating layer forms an electrically conductive trace, in particular for contacting at least one component being surface mounted on the component carrier and/or being embedded in the component carrier;
- wherein the minimum thickness of the plating layer at a bottom of the blind hole is not more than 40 µm;
- wherein one or more of at least one of the at least one electrically conductive layer structure, the plating layer and the electrically conductive structure is patterned, in particular for defining at least one electrically conductive trace;
- wherein no metal foil is arranged between the electrically insulating layer structure of the stack and the electrically conductive plating layer;
- wherein the electrically conductive plating layer is a curved layer, in particular not extending entirely horizontally but extending with two edges in a cross-sectional view.

14. The component carrier according to claim 1, comprising at least one of the following features:
- the component carrier comprises at least one component embedded in and/or surface mounted on the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
- wherein at least one of the at least one electrically conductive layer structure, the plating layer and the structure comprises at least one of a group consisting of copper, aluminum, nickel, silver, gold, palladium, and tungsten, any of the mentioned materials being optionally coated with supra-conductive material such as graphene;
- wherein at least one of the at least one electrically insulating layer structure comprises at least one of a group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
- wherein the component carrier is shaped as a plate;
- wherein the component carrier is configured as one of a group consisting of a printed circuit board, and a substrate;
- wherein the component carrier is configured as a laminate-type component carrier.

15. A method of manufacturing a component carrier, comprising:
- forming a blind hole at least partially in an electrically insulating layer structure, in particular by laser drilling;
- plating an electrically conductive plating layer along and/or above at least part of a horizontal surface of the electrically insulating layer structure outside of the blind hole and extending along at least part of a surface of the blind hole;
- wherein a smallest thickness of the plating layer at a bottom of the blind hole is at least 8 μm;
- wherein forming the blind hole, in particular by laser drilling, comprises forming a window extending through an electrically conductive layer structure stacked on the electrically insulating layer structure, wherein the window forms part of the blind hole and is at least partially aligned with another part of the blind hole in the electrically insulating layer structure; and
- an overhang of the electrically conductive layer structure with the window, which electrically conductive layer structure is arranged on and extends laterally beyond the electrically insulating layer structure.

16. The method according to claim 15, wherein the plating comprises forming part of the electrically conductive plating layer along and on at least part of a horizontal surface of the electrically conductive layer structure outside of the blind hole and extending along at least part of the surface of the blind hole.

17. The method according to claim 15, wherein the method comprises forming the blind hole in an exposed main surface of the electrically insulating layer structure while one or both of opposing main surfaces of the electrically insulating layer structure is or are not covered by an electrically conductive layer structure.

* * * * *